METHOD OF MANUFACTURING ELECTRICAL CONNECTORS
Filed April 8, 1965
FIG. 1.
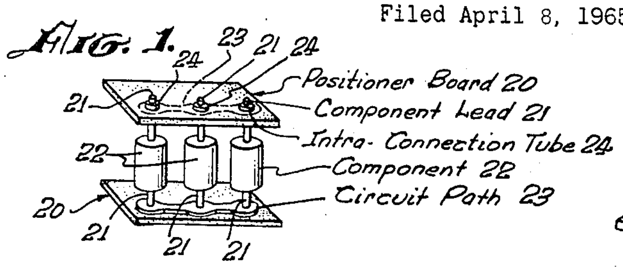
FIG. 9.
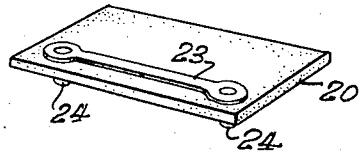
FIG. 2.
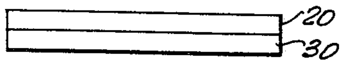
FIG. 10.
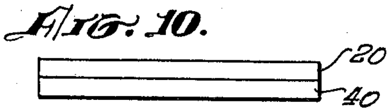
FIG. 3.
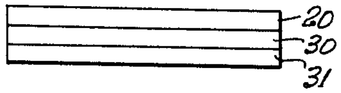
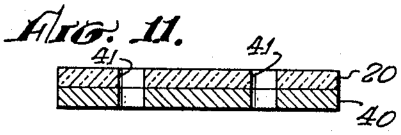
FIG. 4.
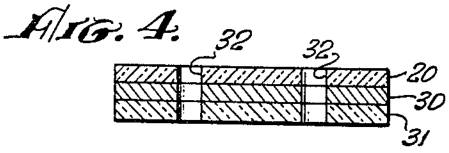
FIG. 12.
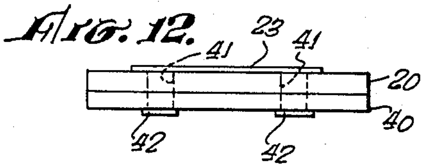
FIG. 5.
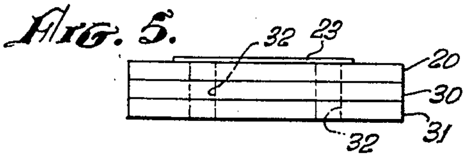
FIG. 13.
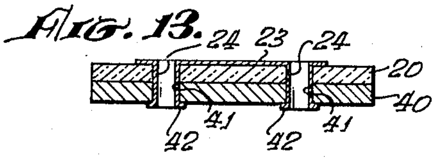
FIG. 6.
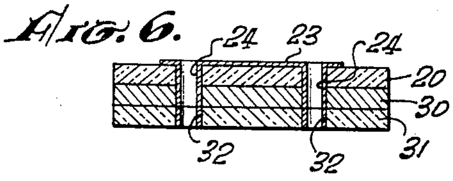
FIG. 14.
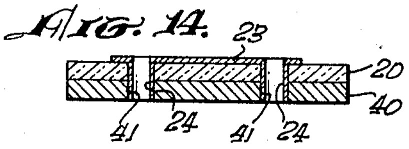
FIG. 15.
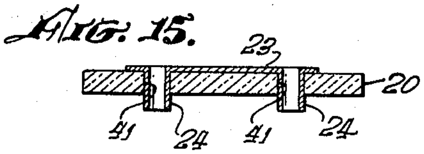
FIG. 7.
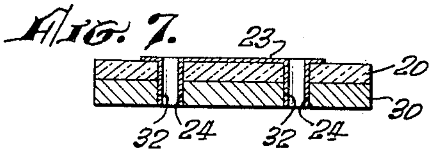
FIG. 8.
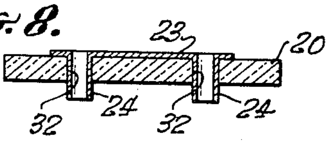
INVENTORS.
EUGENE G. FREEHAUF,
WILLIAM P. DUGAN,
By [signature]
ATTORNEY.

3,429,036
METHOD OF MANUFACTURING ELECTRICAL CONNECTORS

Eugene G. Freehauf, Ontario, and William P. Dugan, Monterey Park, Calif., assignors to General Dynamics Corporation, Pomona, Calif., a corporation of Delaware Filed Apr. 8, 1965, Ser. No. 446,553
U.S. Cl. 29—625 20 Claims
Int. Cl. H05k 3/18, 3/34; B23p 17/04

ABSTRACT OF THE DISCLOSURE

Broadly, the disclosure relates to a method of making integral conductor paths and through-hole tubes in circuit positioner boards on which components are to be mounted. According to the method, a temporary backing material is applied to the board, holes are formed through the assembly; the circuit is printed on the board; the holes are through-plated along with the desired circuit; and finally the backing material is stripped from the assembly to leave through-hole tubes extending from the back of the positioner board.

This invention relates to electrical connectors and more particularly to a method of making electrical connectors utilized to interconnect various elements of electrical or electronic apparatus, such as modules, which are adapted to be mounted within a layer of insulation material.

Devices which serves as a media for attaching electronic component leads to a circuit path in apparatus such as 3D module construction are known. The end result of such devices is a series of circuit paths on a positioner or carrier board with tubes at appropriate places in continuity with these circuits. The function of these tubes is to receive electronic component leads so that they may be connected to the circuit path as used in module construction.

The present invention is an improvement of the manufacturing methods described and claimed in U.S. Patent application 408,283, now Patent No. 3,370,357, and assigned to the same assignee. This invention has for its purpose an improved method of fabricating the above described devices and has the following advantages: (1) the tubes are fabricated as an integral part of the positioner board, which are stronger units and will stand more abuse; (2) there is no chance of mismatch between the hole in the positioner board and the tube as they are one and the same; (3) no "hard tooling" is necessary for limited production as all circuits and tube locations can be transposed directly from engineering drawings; (4) tube height is easy to control because it originates from stable material and a variation in heights, for different applications, can be made easily; and (5) tube diameters can be varied to accept different size component leads.

Therefore, it is an object of this invention to provide a method of manufacturing electrical connectors.

A further object of the invention is to provide a unique method of manufacturing devices which serve as a media for attaching electronic component leads.

Another object of the invention is to provide an improved manufacturing method for producing integral carrier boards and electronic connector devices.

Another object of the invention is to provide an improved method of manufacturing devices which serve as a media for attaching component leads of electronic modules.

Another object of the invention is to provide an improved method of manufacturing devices which contain at least one circuit path on a carrier board with tubes integral therewith and at appropriate places in continuity with the circuit path.

Other objects and advantages of the invention will become apparent from the following detailed description taken in connection with the accompanying drawings, in which:

FIG. 1 is a view illustrating an application of electrical connectors made in accordance with this invention;

FIGS. 2–9 illustrate the steps of a manner for carrying out the invention; and

FIGS. 10–15 illustrate the steps of a preferred manner of carrying out the invention.

Referring now to the drawings, FIG. 1 illustrates an application of the tubes made in accordance with the invention wherein positioner boards 20 are intra-connected with leads 21 of a plurality of components 22. Integral with each board 20 is a circuit path 23 interconnecting the component leads 21 and intra-connection tubes 24 of material such as nickel through which component leads 21 extend. The circuit path 23 in the upper board is underneath the board as shown in dotted lines while the connection tubes 24 in the lower board extend under the board and thus are not shown but are the same as shown in the upper board 20. Component leads 21 and tubes 24 are interconnected by welding across the diameter of the tube which provides two welded areas at the inside interfaces of the wall of the tube and the component lead thus giving greater reliability over the single tangential weld obtained with the conventional methods. Also, with this type of connection, the welder electrodes are normally in contact with the same type of material, namely, the tube wall, regardless of the type of material from which the component leads are made. If desired, the leads 21 and tubes 24 may be interconnected by soldering.

The sequence of operation of one manner of carrying out the improved method illustrated in FIGS. 2–9 is as follows:

(1) Bond a sheet of epoxy glass laminate, having a cured thickness of that of the positioner board 20, to an aluminum sheet 30 having the same thickness as the height of tubes 24 (see FIG. 2), board 20 serving as the circuit carrier board.

(2) Bond a sheet of glass epoxy board 31 or equivalent (approximately 0.015 inch thick) to the aluminum sheet 30 (see FIG. 3) with an adhesive that is non-responsive to plating.

(3) Drill holes 32 of appropriate size (approximately 0.010 inch larger than the component lead diameter) through the three bonded pieces (20, 30, 31) at those places requiring a tube 24 in the circuit (see FIG. 4).

(4) Electro copper plate all exposed aluminum surfaces to approximately 0.0002 inch thick.

(5) Electroless copper plate all surfaces to approximately 0.0001 inch thick.

(6) Remove, by mechanical procedure, the electroless copper plate from the bottom surface of board 31, thus preventing adhesion of the following plating to this surface.

(7) Electro copper plate all surfaces to approximately 0.0017 inch thick.

(8) Silk screen in conventional manner a circuit path indicated by FIG. 5 on top of the assembly.

(9) Electro plate with nickel, or equivalent, all non silk screened and drilled surfaces to the required thickness to define circuit path 23, and define tubes 24 having walls of approximately 0.004 inch (see FIG. 6).

(10) Remove bottom epoxy board 31 and discard (see FIG. 7). Remove any remaining adhesive from the assembly. Note that tubes 24 terminate at the lower surface of aluminum sheet 30.

(11) Remove resist from the silk screening operation by cleaning with suitable solvent.

(12) Dissolve aluminum sheet 30 by immersing in sodium hydroxide (see FIG. 8).

(13) Remove the copper from clad board 20 and around tubes 24 by immersing in copper stripper thus producing an end product wherein the nickel tubes 24 are made integral with positioner board 20 and with the combination copper and nickel circuit path 23 as shown in FIG. 9.

In the final porduct illustrated in FIG. 9 the configuration of circuit path or paths 23 and the location of tubes 24 is determined by the specific requirements, number of component leads, etc., of any specific application.

The sequence of operation of the preferred manner of carrying out the invention illustrated in FIGS. 10–15 is as follows:

(1) Bond a sheet of epoxy glass laminate, having a cured thickness of that of the positioner board 20, to an aluminum sheet 40 having the same thickness as the height of tubes 24 (see FIG. 10). If desired, the glass epoxy board 20 may have copper bonded thereto prior to the bonding with aluminum sheet 40. Board 20 serves as the circuit carrier board.

(2) Drill holes 41 of appropriate size (approximately 0.010 inch larger than the component lead diameter) through the two bonded pieces 20 and 40 at those through the two bonded pieces 20 and 40 at those places requiring tube 24 in the circuit (see FIG. 11).

(3) Electro copper plate all exposed aluminum surfaces to approximately 0.002 inch thick.

(4) Electroless copper plate all surfaces to approximately 0.0001 inch thick.

(5) Electro copper plate all surfaces to approximately 0.0017 inch thick. If board 20 has been initially provided with copper, the thickness of this plating is approximately 0.0005 inch.

(6) Define the required circuit indicated at 23 on sheet 20 and pads 42 on sheet 40 by means such as the conventional silk screen procedure. The pads 42 serve to ensure even plating current and thus proper plating of drilled holes 41 which form the tube walls (see FIG. 12).

(7) Electro plate with nickel, or equivalent, all non silk screened and drilled surfaces to the required thickness to define circuit path 23, and define tubes 24 having walls of approximately 0.004±0.001 inch (see FIG. 13).

(8) Remove the resist from the silk screening procedure by cleaning with solvent.

(9) Remove the chopper from the aluminum sheet 40 by suitable chemical procedure.

(10) Remove by mechanical procedure pads 42 such that the nickel plated tubes terminate ush with aluminum sheet 40 (see FIG. 14).

(11) Dissolve aluminum sheet 40 by immersing in sodium hydroxide (see FIG. 15).

(12) Remove the copper from clad board 20 and around tubes 24 by immersing in copper stripper thus producing an end product which is the same as that shown in FIG. 9 wherein the nickel tubes 24 are made integral with positioner board 20 and with the combination copper and nickel circuit path 23.

As set forth above the configuration of the circuit path and the location of the tubes is determined by the specific requirements of various applications.

It has thus been shown that the invention provides a unique method of manufacturing media for attaching electronic component leads to a circuit path having the following advantages: (1) regardless of component lead material, the welder electrodes are always in contact with the same type of material, i.e., the nickel, or equivalent material, in the tube wall which reduces sharply the number of variations in weld schedules for a given system; (2) the tubes are self-aligning with respect to the component leads, eliminating the location and slippage problems which occur when welding round leads to flat ribbon or circuit tabs, and reducing considerably the labor or assembly time; (3) pre-established interconnect circuitry eliminates the possibility of operator-caused wiring errors; and (4) tube welding gives greater reliability by providing two welds inside each tube, instead of the single tangential weld obtained with other systems. In addition, the tubes and component leads can be effectively interconnected by soldering.

While specific types of materials have been set forth hereinbefore, it is understood that other materials which fulfill the requirements may be utilized.

Although particular procedures for carrying out the invention have been illustrated and described, modifications will become apparent to those skilled in the art, and it is intended to cover in the appended claims all such modifications as come within the spirit and scope of the invention.

What we claim is:

1. A method of manufacturing electrical connectors of the type having an integral positioner board, at least one circuit path on one side of the positioner board and connector members integral with the circuit path and extending from the opposite side of the positioner board comprising the sequential steps of bonding an aluminum backing material of a thickness equal to at least the desired height of the connector members to the positioner board, providing apertures of predetermined diameter and number through the thus bonded layer assembly, electroless copper plating all surfaces, electro copper plating all surfaces to a desired thickness, defining at least one circuit on the top surface of the assembly, electroplating with a conductive material predetermined surfaces which include at least the aperture surfaces to define the required connector member wall thickness, dissolving the aluminum backing material thus leaving the connector members extending through the positioner board and outwardly a predetermined distance from the positioner board on the side thereof opposite the finished circuit.

2. A method of making integral circuit paths and through-hole connector members to the positioner board in circuit positioner boards on which components are adapted to be mounted comprising the sequential steps of bonding a metallic backing material of a thickness equal to at least the desired height of the connector members, drilling holes through the thus bonded assembly, defining at least one circuit on the board, plating to form the through-hole connector members and desired circuit path, and dissolving the metallic backing material from the board, thereby leaving the connector members extending outward a predetermined distance from the surface of the positioner board opposite the surface on which the circuit path is located.

3. A method of making nickel tubes integral with a positioner board and with combination copper and nickel circuits comprising the steps of bonding together a board constructed of cured epoxy glass laminate and a sheet of aluminum of the same thickness as the desired tube height, bonding a second glass epoxy board to the aluminum sheet with an adhesive that is non-responsive to plating, forming holes of appropriate size through the bonded assembly at the places requiring a tube in the circuit, electro copper plating all exposed aluminum surfaces, electroless copper plating all surfaces of the assembly, removing the copper plating from the bottom surface of the assembly, electro copper plating all adhesive surfaces of the assembly, defining at least one circuit path on the top surface of the assembly, electro plating with nickel certain surfaces of the assembly to the required thickness thus forming the tube walls, removing the bottom epoxy board and the associated non-responsive adhesive thus forming the terminal ends of the tubes, removing resist material utilized in defining the circuit, dissolving aluminum sheet, and removing the exposed copper from the positioner board and from around the tubes.

4. The method defined in claim 3, wherein the holes formed in the assembly are approximately 0.010 inch larger than the component lead diameter which is adapted to be positioned therein.

5. The method defined in claim 3, wherein the exposed aluminum surfaces are plated to a thickness of approximately 0.0002 inch.

6. The method defined in claim 3, wherein the surfaces are electroless copper plated to an approximate thickness of 0.0001 inch.

7. The method defined in claim 3, wherein the adhesive surfaces are electro copper plated to an approximate thickness of 0.0015 inch.

8. The method defined in claim 3, wherein the tubes are plated to a wall thickness of approximately 0.004 inch.

9. The method defined in claim 3, wherein the circuit path is defined by the silk screening process.

10. The method defined in claim 3, wherein sodium hydroxide is utilized to dissolve the aluminum sheet.

11. The method defined in claim 3, wherein the copper is removed from the positioner board by immersing the board in a copper stripper solution.

12. A method of making nickel tubes integral with a positioner board and with combination copper and nickel circuits comprising the steps of bonding a cured epoxy glass laminate positioner board to a sheet of aluminum of the same thickness as the desired tube height, forming apertures of appropriate size through the bonded assembly at the places requiring a tube in the circuit, electro copper plating all exposed aluminum surfaces, electroless copper plating all surfaces of the assembly, electro-copper plating all surfaces of the assembly, defining the required circuit path on the top surface of the assembly and predetermined pads on the bottom surface of the assembly, electro plating with nickel certain surfaces on the assembly to the required thickness thus forming the tube wall and circuit, removing the resist material utilized in defining the circuit, chemically removing the copper from the aluminum sheet, mechanically removing the thus formed pads, dissolving the aluminum sheet, and removing the exposed copper from the positioned board and from around the tubes.

13. The method defined in claim 12, wherein the holes formed in the assembly are approximately 0.010 inch larger than the component lead diameter adapted to be positioned therein.

14. The method defined in claim 12, wherein the exposed aluminum surfaces are plated to a thickness of approximately 0.0004 inch.

15. The method defined in claim 12, wherein the surfaces are electroless copper plated to an approximate thickness of 0.0001 inch.

16. The method defined in claim 12, wherein all electroless copper plated surfaces are electro copper plated to an approximate thickness of 0.0015 inch.

17. The method defined in claim 12, wherein the circuit path is defined by the silk screening process.

18. The method defined in claim 12, wherein the tubes are plated to a wall thickness of about 0.004 inch.

19. The method defined in claim 12, wherein the positioner board is copper clad and wherein a thickness of 0.0005 inch is produced by the defined electro copper plating surface step.

20. The method defined in claim 12, wherein sodium hydroxide is utilized to dissolve the aluminum sheet.

References Cited

UNITED STATES PATENTS

| | | | |
|---|---|---|---|
| 3,040,426 | 6/1962 | Hamren. | |
| 3,261,769 | 7/1966 | Coe et al. | |
| 3,345,741 | 10/1967 | Reimann | 29—626 |
| 3,357,099 | 12/1967 | Nagy et al. | 29—625 |
| 3,370,351 | 2/1968 | Freehauf et al. | 29—625 |

JOHN F. CAMPBELL, *Primary Examiner.*

D. C. REILEY, *Assistant Examiner.*

U.S. Cl. X.R.

29—527, 423, 626